United States Patent
Jochemsen et al.

(10) Patent No.: US 7,529,987 B2
(45) Date of Patent: May 5, 2009

(54) INTEGRITY CONTROL FOR DATA STORED IN A NON-VOLATILE MEMORY

(75) Inventors: Robert Jochemsen, Eindhoven (NL); Nicolaas Lambert, Eindhoven (NL); Wilhelmus Franciscus Johannes Fontijn, Eindhoven (NL); Adrianus Johannes Maria Denissen, Eindhoven (NL)

(73) Assignee: NXP B.V., Eindhoven (NL)

( * ) Notice: Subject to any disclaimer, the term of this patent is extended or adjusted under 35 U.S.C. 154(b) by 273 days.

(21) Appl. No.: 10/559,174

(22) PCT Filed: May 26, 2004

(86) PCT No.: PCT/IB2004/050774

§ 371 (c)(1),
(2), (4) Date: Dec. 1, 2005

(87) PCT Pub. No.: WO2004/109704

PCT Pub. Date: Dec. 16, 2004

(65) Prior Publication Data

US 2006/0155882 A1    Jul. 13, 2006

(30) Foreign Application Priority Data

Jun. 5, 2003    (EP)    .................. 03101645

(51) Int. Cl.
*G11C 29/00* (2006.01)
(52) U.S. Cl. ..................................... 714/718
(58) Field of Classification Search .................. 714/718
See application file for complete search history.

(56) References Cited

U.S. PATENT DOCUMENTS

| | | | |
|---|---|---|---|
| 5,533,034 A * | 7/1996 | Kuwata et al. | 714/748 |
| 5,606,662 A | 2/1997 | Wisor | |
| 5,917,750 A | 6/1999 | Miyakawa et al. | |
| 5,958,079 A * | 9/1999 | Yoshimura | 714/766 |
| 6,058,047 A * | 5/2000 | Kikuchi | 365/185.33 |
| 6,185,718 B1 | 2/2001 | Dell et al. | |
| 7,114,117 B2 * | 9/2006 | Tamura et al. | 714/763 |
| 7,206,891 B2 * | 4/2007 | Emerson et al. | 711/100 |
| 2002/0008988 A1 | 1/2002 | Lenssen et al. | |
| 2002/0029365 A1 * | 3/2002 | Sato et al. | 714/763 |
| 2002/0044481 A1 | 4/2002 | Hidaka | |
| 2002/0154540 A1 | 10/2002 | Sekiguchi et al. | |
| 2003/0131277 A1 * | 7/2003 | Taylor et al. | 714/5 |
| 2004/0059985 A1 * | 3/2004 | Sharp | 714/763 |

FOREIGN PATENT DOCUMENTS

WO    WO 00/72324    11/2000

* cited by examiner

*Primary Examiner*—James C Kerveros

(57) ABSTRACT

The present invention relates to a write controller for a memory with a plurality of non-volatile storage cells, a read controller for a memory with a plurality of nonvolatile storage cells, to a combined write/read controller, to a solid state device comprising a memory with a plurality of non-volatile storage cells, a programmer device for writing a binary code to a non-volatile memory, to a method for writing data comprising at least one input bit to a memory having non-volatile storage cells, and to a method for controlling the integrity of data comprising at least one input bit stored in non-volatile storage cells of a memory. The basic concept of the present invention is to extend information stored in a non-volatile memory by at least one checking bit. The checking bit is allocated to one code bit, or to each of a plurality of code bits.

14 Claims, 5 Drawing Sheets

INTEGRITY CONTROL FOR DATA STORED IN A NON-VOLATILE MEMORY

The present invention relates to a write controller for a memory with a plurality of non-volatile storage cells, a read controller for a memory with a plurality of non-volatile storage cells, to a combined write/read controller, to a solid state device comprising a memory with a plurality of non-volatile storage cells, to a programmer device for writing a binary code to a non-volatile memory, to a method for writing data comprising at least one input bit to a memory having non-volatile storage cells, and to a method for controlling the integrity of data comprising at least one input bit stored in non-volatile storage cells of a memory.

A non-volatile memory has the advantage of keeping stored information even when no operating power is provided to the memory. Working principles of non-volatile memories known today are based on physical effects such as magnetic, ferroelectric, or semiconductor effects. Known non-volatile memory devices comprise for instance magnetic random access memory (MRAM), erasable programmable read only memory (EPROM), electrically EPROM (EEPROM), Flash memory, etc.

A non-volatile memory is a rewritable memory. In contrast to read-only memory technologies, the non-volatility of the storage mechanism is not able to prevent an undesired change of the stored information. In an MRAM, stored information may change for instance under the influence of thermal effects, random flipping of the orientation of individual magnetic cells, or tampering. Tampering with an MRAM may involve applying a high external magnetic field to the memory. Applying such a magnetic field to an MRAM will cause all storage cells to align the magnetic moments of their respective magnetic storage layer parallel to the strong external field. All storage cells, including checking bits, will then store the same bit value, either 0 or 1. Thus, the information stored originally in the memory will be lost.

Unauthorized changes to information classified as "read-only" or "no access" may also be attempted by specially designed applications in the form of software or hardware.

The possibility of an undesired rewriting of non-volatile memory cells constitutes a security problem that limits the use of non-volatile memories in commercial uses where integrity of provided information is crucial. In digital rights management (DRM), for example, unique identifiers of solid state devices can be used like a key for granting or denying admission to privileged information, to a privileged quality of service, and for collecting billing information. Such a unique identifier typically consists of a binary code written to a memory integrated into the solid state device. Identifiers with rewritten bits may result in denial of previously granted access rights, or in a grant of access to an intruder, or in wrong billing statements.

Applications are usually not allowed to change "read-only" or "no access" information such as identifiers. In fact, care is taken that it is impossible to modify such information. A protection system for a non-volatile semiconductor memory is known for instance from U.S. Pat. No. 5,917,750. In this memory, a protect circuit is provided that generates a protect signal indicating whether or not data stored in the memory cells is protected. Writing is only allowed to memory sections, to which the protect signal indicates writing access. However, this system requires a large amount of additional circuitry connected to the memory while not preventing internal effects. For MRAM, physical shielding mechanisms are known from WO 00/72324 A1 and US 2002/0008988 A1. Both documents describe additional shielding layers in the memory. Such additional physical shielding increases the cost of the memory and cannot safely prevent strong external fields or unauthorized applications from rewriting the memory.

These disadvantages of the cited protection mechanisms show that known write protection mechanisms involve a large technological effort, but cannot provide full safety against rewriting a non-volatile memory.

It is therefore an object of the present invention to provide an alternative way to prevent damage caused by accidental or intentional changes to "read-only" or "no access" information stored in a non-volatile memory.

According to a first aspect of the invention, the object is solved by a write controller for a memory with a plurality of non-volatile storage cells, comprising an input for receiving input data having at least one input bit to be written to said memory, and being adapted to generate from said input data output data and allocated address information, wherein said output data comprises said input data and at least one checking bit allocated to said input bit, said checking bit having a value complementary to that of said input bit, and wherein said address information allocates said checking bit to a storage cell allocated to the storage cell storing said respective input bit.

The present invention steps away from attempts to provide a better write protection. It focuses on the reliable detection of changes that have occurred to the content of a non-volatile memory. The basic concept of the present invention is to extend information stored in a non-volatile memory by at least one checking bit. The information to be stored is herein referred to as input bits, or, equivalently, code bits. The term input bit is used to make clear that the write controller of the present invention receives these bits to be stored from a memory client at its input. It does not generate these bits.

In contrast to the input bit, which is received from an external source, the write controller of the present invention does generate the checking bit. The write controller further allocates a checking bit to a respective input bit. In order to avoid confusion due to complicated generalizations, the singular form "checking bit" will be used hereinafter whenever one or more checking bits can be used. The alternative cases of only one checking bit and of a plurality of checking bits will be addressed explicitly whenever embodiments of the invention make use of the respective case.

According to the present invention, the checking bit has a value that is complementary to the value of the respective input bit the checking bit is allocated to. That is, if the input bit has the value 1 the checking bit has the value 0, and vice versa. A change in the input bit or in the checking bit can easily be detected. A change is detected to have occurred when both the input bit and the checking bit have the same value. Thus, by providing a checking bit with a complementary value, the present invention allows to detect changes to a memory by non-selective external influences often used in tampering attempts. For instance, exposure of an MRAM to a high external magnetic field will set all memory cells to an equal value, thus destroying the fixed relation between input and checking bits that indicates integrity of the data according to the present invention. As another example, exposure of a EPROM memory to UV radiation will have the same effect.

The explicit algorithm providing the allocation between the input bit and the checking bit is different in different embodiments, as described below. The allocation must not change in order to prevent mistakes in the detection of changes to the memory content. A checking bit can be allocated to only one input bit or any number of input bits. For instance, in one embodiment, only one input bit has an allocated checking bit. One checking bit is enough to detect overwriting of the memory by non-selective influences such as high forces created by external sources. In another embodiment, every input bit has an allocated checking bit. This allows to detect selective changes to individual input bits classified as "read-only" or "no access".

In order to provide a simple allocation between input bit and checking bit, the allocation of input bit and checking bit is preferably reflected in the location of the respective bits relative to each other in the memory. The write controller of the invention generates the respective address information for both the input bit and the checking bit according to a predefined allocation algorithm. The address information is used to store the output data, comprising input data plus checking bit(s), in memory cells that correspond to the address information. The address information can be an additional part of the output data of the write controller, but will not be stored to the memory. In an alternative embodiment, the address information is provided in the form of electrical signals applied to a particular word line and a particular bit line of the memory. That is, the write controller has integrated word-line and bit-line drivers to physically address a particular memory cell that a particular output data bit is to be written to.

In one embodiment of the write controller of the invention, the write controller allocates address information to address data provided to the write controller from an external memory client as a part of the input data. The write controller of the invention is in this embodiment adapted to receive input data that comprise address data in addition to input bits. In one alternative, such address data is received as a part of the input data stream through the same input port of the write controller. In another alternative, the address data is received by the write controller through a separate input port synchronously with the corresponding input bits.

In one alternative of this embodiment, the write controller uses the received address data as address information for that part of the output data that is identical to the input bits. In this alternative, the write controller generates new address information for checking bits. This new address information depends on the address data provided by the external memory client. This addressing method needs precautions to avoid conflicts between address data provided from an external client and address information the write controller generates internally for checking bits according to the predefined allocation algorithm. Such precautions for instance comprise providing memory clients with information on available address ranges.

In another alternative of this embodiment, the write controller generates new address information allocated to the address data provided by the external memory client. The write controller may for this purpose maintain an address allocation table that translates address data received at the input into address information provided at the output of the write controller. This allocation table is preferably shared with a read controller of the memory. In this alternative, an external memory client provides address data for input bits, and the write controller generates address information for input bits as well as checking bits. The address information generated by the write controller can neither be controlled by an external memory client, nor is it communicated to an external memory client. The checking bit algorithm for securing data integrity is completely transparent to external memory clients.

For reading requests, external memory clients use the address data provided when storing the data and provide them to a read controller. The read controller refers to the address allocation table and translates the address data into the address information of the corresponding input bits stored in the memory to provide these input bits to the memory client, given the integrity of the stored data. This aspect will be described in more detail in the context of the description of the read controller of the invention. Preferably, input and allocated checking bit are stored in physically close memory cells. Physically close bits are likely both influenced by a local external field. By providing a close local arrangement of input and checking bits it will be more likely to detect that an external field was applied to a limited range of the memory.

According to a preferred embodiment, the checking bit is stored in a memory cell neighboring the memory cell of the allocated input bit. The neighboring cell can in different embodiments be in the same row or in the same column. In a matrix-like arrangement of memory cells, the next neighbor may also be determined to be in a neighboring row and neighboring column, i.e., in a diagonal arrangement relative to the memory cell storing the input bit.

It is preferred to use a next neighbor for storing the checking bit in order to provide a most simple and flexible solution that is adapted to be used also in small memory arrays and single memory lines comprising only a small number of cells for storing identifiers. Accordingly, the write controller of the invention is preferably adapted to generate address information allocating said checking bit to a storage cell neighboring the storage cell storing said respective input bit.

However, the present invention is not restricted to this arrangement. In other embodiments of the invention a checking bit allocated to an input bit is stored in a storage cell determined using a different allocation algorithm. For instance, the checking bit could be stored in a second- or third-nearest neighbor cell in the same row or the same column of the memory cell storing the input bit.

While the concept of using checking bits is known in different contexts, the present invention provides a new approach to checking bits that is especially useful for securing the integrity of stored information and enabling an effective detection of changed information. The use of checking bits is known from the field of digital data transmission. There, checking bits for instance take the form of a frame check sequence (FCS) in the framework of cyclic redundancy check (CRC) methods for detecting transmission errors in a received data sequence due to poor transmission conditions. An FCS for a CRC is typically two Bytes long and is calculated according to an algorithm using binary polynom equations. In the same context, another concept of error detection in data transmission is the use of a parity bit. A parity bit is added to a block consisting of a number of bits and reflects the fact whether an even or odd number of bits having the bit value "1" is contained in the block. In the case of an even parity, the parity bit will be "1", and in the case of an odd parity, the parity bit will be "0".

The present solution, even though making use of checking bits, differs from the concept of CRC and parity check. The checking bits used in the present invention, in contrast to both known methods mentioned, are allocated to an individual input bit, not to a number of bits. This provides a much higher flexibility in the particular design of the write controller. The write controller of the invention can be designed according to given boundary conditions. The number of checking bits used and the number input bits of a particular stored code that is allocated one or more checking bits can be determined in dependence on a given hardware design. For instance, if the task is to allow detection of a tampering attempt by application of a strong external magnetic field to an MRAM, it will suffice to provide one checking bit allocated to one input bit, for instance the first input bit of an identifier. A further difference of the checking bit according to the present invention as compared to known checking bit concepts is that the algorithm for determining the value of the checking bit of the present invention is much simpler. In fact, a simple inverter can be used to generate the checking bit. This simplicity is an important advantage over the algorithms known, because it does not require much circuitry for determining the value of the checking bit. As a further difference to known checking bit concepts, the checking bit of the present invention is hidden to external applications, or, in other words, memory clients. It is created (and checked) without any communication or transparency to memory clients.

In several different embodiments of the write controller according to the first aspect of the invention the output data comprises a number of checking bits allocated to a respective input bit. The number of checking bits is fixed in each embodiment. In a matrix-like arrangement of memory cells between 2 and 8 checking bits can be allocated to a respective input bit in next-neighbor memory cells. In a linear arrangement of memory cells a maximum number of two checking bits allocated to an input bit in next-neighbor memory cells is possible. In these embodiments, said address information allocates each checking bit to a respective storage cell in a linear or, respectively, matrix-like arrangement of storage cells, such that a linear or two-dimensional pattern of stored bit values is created for each set of input bit and checking bits allocated thereto. A higher number of checking bits clearly has the disadvantage of requiring a larger memory space. On the other hand, larger checking bit patterns are more difficult to decipher in attempts to manipulate the content of the memory on the basis of individual bits, so that being able to produce such larger checking bit patterns is useful for hiding the checking bit algorithm and for making manipulation attempts on individual memory cells easier to detect.

A preferred embodiment of the write controller of the invention comprises a checking bit generator connected to said input. The checking bit generator is adapted to ascertain the bit value of an input bit to be written to the non-volatile memory and to generate a checking bit that has a bit value complementary to the bit value of said input bit. The checking bit generator is in one embodiment provided by dedicated circuitry. In another embodiment, the checking bit generator is provided by an embedded software.

A further preferred embodiment of the write controller of the invention comprises an address information generator connected to said input and to said checking bit generator. The address information generator is adapted to allocate to said at least one input bit and to said allocated at least one checking bit respective address information of storage cells neighboring each other. The address generator is in one embodiment provided by dedicated circuitry. In another embodiment, the address generator is provided by an embedded software. Address information can take the form of a binary code representing the address allocated to a memory cell in a memory. It can also take the form of electrical signals applied to selected word and bit lines, thus directly addressing individual memory cells without an intermediate step of translating a binary code into such signals.

According to a second aspect of the invention, a read controller for a memory with a plurality of non-volatile storage cells is provided. The read controller of the invention comprises an input for receiving read-out data from the memory. The read-out data has at least one input bit and at least one checking bit allocated thereto. The read controller of the invention further has an integrity-control unit that is adapted to compare said at least one input bit and said at least one checking bit values and to provide an output signal indicating whether or not said code bit and said checking bit values are complementary.

The read controller of the invention is a complementary counterpart of the write controller described above. The read controller serves to check the integrity of the data written to the non-volatile memory with the aid of the write controller of the invention. As such, the read controller is based on the same checking bit algorithm as the write controller. It "knows" which group of memory cells must be addressed to check the integrity of a particular input bit. Therefore, preferred embodiments of the read controller can be directly deduced from corresponding embodiments of the write controller of the invention.

For instance, in one preferred embodiment of the read controller of the invention, the checking bit pattern used by the write controller for an input bit is also used by the read controller in order to check the integrity of the input bit. The read controller has an address generator that is adapted to generate a read request directed to at least one selected memory cell and said at least one neighboring memory cell storing said allocated checking bit. The address generator uses the same particular number of memory cells to be compared and the same addresses resulting from the checking bit pattern created. In an alternative embodiment the read controller uses less checking bits for the integrity check than the write controller has created. Address information created by the read controller can take the form of a binary code representing the address allocated to a memory cell in a memory. It can also take the form of electrical signals applied to selected word and bit lines, thus directly addressing individual memory cells without an intermediate step of translating a binary code into such signals.

It is noted that the read controller is not adapted to communicate checking bits read from the non-volatile memory to external applications. The integrity check is performed internally by the integrity-control unit. Only the result of the integrity check can be communicated as a binary signal indicating whether or not the input bit and the checking bit allocated thereto are complementary. The read controller is not adapted to communicate this binary signal beyond the limits of the chip it is integrated into, unless further security measures are provided like encryption. The read controller may be provided in the form of an IP block of a chip, i.e., as an independent part inside the chip. In this embodiment, the read controller may or may not, according to the choice of the chip designer, be adapted to communicate the binary signal on chip, but not beyond that.

If one would use regular wiring between chips to communicate the binary integrity signal, it would be a trivial operation to "hack" this signal, by for example disconnecting the wire from the controller, and connecting it to an "always ok" source. According to the invention, it is important to have a tamper-resistant communication.

In operation, the integrity control unit comprised by the read controller of the invention compares an input bit on one hand with one or more allocated checking bits on the other hand. In an embodiment comprising a plurality of input bits with allocated checking bits a number of parallel comparator stages connected to the input is provided to increase the speed of the integrity control. However, for situations in which speed is not important, an alternative embodiment has only one comparator stage, and the integrity check is performed sequentially for each input bit having an allocated checking bit.

According to a third aspect of the invention a read/write controller for a memory with a plurality of non-volatile storage cells is provided. The read/write controller comprises the write controller of the first aspect of the invention and the read controller according to the second aspect of the invention.

The read/write controller combines the advantages of the write controller and the read controller described above. It is particularly useful when writing to the non-volatile memory and reading from the non-volatile memory is to be performed by one unit. In contrast thereto, a write controller alone is enough for a device that only serves for programming a non-volatile memory on a chip, such as a programmer described below. The integrity check can be performed by a read controller provided on chip.

According to a fourth aspect of the invention, a programmer device for writing a binary code to a non-volatile memory is provided. The programmer device comprises the write controller of the first aspect of the invention. The write controller is adapted to receive the binary code at its input.

Programmer devices are typically used in the production of integrated circuits (ICs), and are can be integrated into an IC tester or digital IC verification system. In many manufacturing processes of ICs comprising a non-volatile memory, it is necessary to initialize the non-volatile memory. This task is performed by a programmer device. According to the present aspect of the invention, such a programmer device is provided with the additional functionality of programming a non-volatile memory comprised by an IC using the write controller of the present invention. This way the manufactured ICs are provided with an efficient integrity control mechanism. An IC may comprise the read controller of the invention in order to be able to detect a violation of the integrity of the stored data.

Preferred embodiments of the programmer device comprise those mentioned above for the write controller of the first aspect of the invention.

A further preferred embodiment of the programmer device of the invention comprises a code generator that is connected to the input of the write controller and adapted to generate a unique identifier code and provide it to the input of said write controller. A unique identifier code comprises a combination of code bits that is created individually for each IC. This way, the programmer provides a unique identifier for each manufactured IC. The person skilled in the art knows how unique identifiers can be generated. An example is the generation and programming of unique MAC-addresses in the manufacturing process of Ethernet controllers. A certain first combination of identifier bits is attributed uniquely to a particular manufacturer who adds a second combination of identifier bits that are unique within the production process of this particular manufacturer, thus creating a globally unique identifier, the so called MAC-address.

In an alternative embodiment the programmer is connected to an external code generator that transmits the unique identifier to the programmer for providing it as an input to the write controller. In a further alternative embodiment the programmer comprises a memory that stores a list of unique identifiers to be provided as an input to the write controller.

According to a fifth aspect of the invention, a solid state device is provided comprising a memory with a plurality of non-volatile storage cells and the write controller of the first aspect of the invention, or the read controller of the second aspect of the invention connected to said memory, or both.

A solid state device according to the present aspect of the invention is any device comprising electronic circuitry. Examples of such solid state devices are ICs, devices comprising ICs, such as a memory device in the form of an MRAM, PROM, EPROM, EEPROM, Flash memory, a computer card, such as a PCMCIA card. The solid state device of the invention has a memory comprising non-volatile storage cells. It is noted that the memory may comprise a combination of volatile and non-volatile storage cells, also in the form of different memories provided separately in the solid state device.

The preferred embodiments of the solid state device of the present aspect of the invention comprise the embodiments of the write controller and of the read controller of the invention.

In a further preferred embodiment the solid state device comprises magnetic storage cells, such as MRAM cells. MRAM is a very promising technology that has good prospects to overcome the disadvantages of present memory technologies while keeping their advantages.

In a preferred embodiment based on MRAM technology the solid state device of the present aspect of the invention has at least two neighboring MRAM cells with a larger size than all other storage cells in said memory. In this embodiment the write controller is adapted to create address information allocating said input bit and said allocated at least one checking bit to neighboring high-field storage cells. Using cells with a larger size in an MRAM to store the input bit and the checking bit has the advantage that a (natural) random bit flip should not occur. Therefore, bit flips caused by an external field (i.e., tampering) can be detected unambiguously, thus increasing the reliability of the integrity control.

It is noted that in prior art MRAMs, all memory cells have approximately equal sizes. The term size refers to the lateral extensions of the storage layers of an MRAM cell in directions perpendicular to the layer sequence of the cell, and to the thickness of the storage layer in the direction of the layer sequence. A storage layer is a layer of a memory cell that aligns the orientation of its magnetic moment in interaction with a magnetic field used for writing the cell. An MRAM comprising at least two groups of memory cells with different storage layer sizes is considered an independent invention.

According to a sixth aspect of the invention, a method for writing data comprising at least one input bit to a memory having non-volatile storage cells is provided, comprising the steps of a) ascertaining a bit value of at least one checking bit allocated to said input bit as the bit value complementary to the bit value of said input bit, b) allocating non-volatile memory cells to the input bit and the checking bit according to a predetermined allocation algorithm, c) and writing said at least one checking bit and said input bit to the non-volatile storage cells of said memory allocated according to step b).

The method of the present aspect of the invention allows storing data in a non-volatile memory so that it can later be checked for its integrity. For instance, the method of the invention can be applied by a programmer device. The advantages of the method have been described earlier in context with the description of the other aspects of the invention, in particular, the write controller. The method is preferably used for storing identifiers or information that is similarly classified as "read only" or "no access". As described above in more detail, the allocation algorithm preferably comprises allocating said input bit and said checking bit to neighboring storage cells. Further preferred embodiments of the method of the invention are given by the description of the write controller according to the first aspect of the invention.

According to a seventh aspect of the invention, a method for checking the integrity of data comprising at least one input bit stored in non-volatile storage cells of a memory is provided, comprising the steps of a) ascertaining a bit value of at least one checking bit allocated to said input bit as the bit value complementary to the bit value of said input bit,
b) allocating non-volatile memory cells to the input bit and the checking bit according to a predetermined allocation algorithm,
c) writing said checking bit and said input bit to the non-volatile storage cells allocated according to step b),
d) reading said input bit and said checking bit from said allocated storage cells,
e) comparing said input bit and said checking bit
f) providing a signal indicating whether or not said input bit and said checking bit are complementary.

The method steps d) through f) are in a preferred embodiment performed repeatedly. Preferably, there is a waiting step between consecutive cycles of performing steps d) through f). A useful waiting time can be anywhere on the time scale between a minute and a number days, depending on the environment the memory cells are exposed to and the frequency of access to the memory.

Further features and advantages of the invention are described below with reference to the figures.

Figure 1:
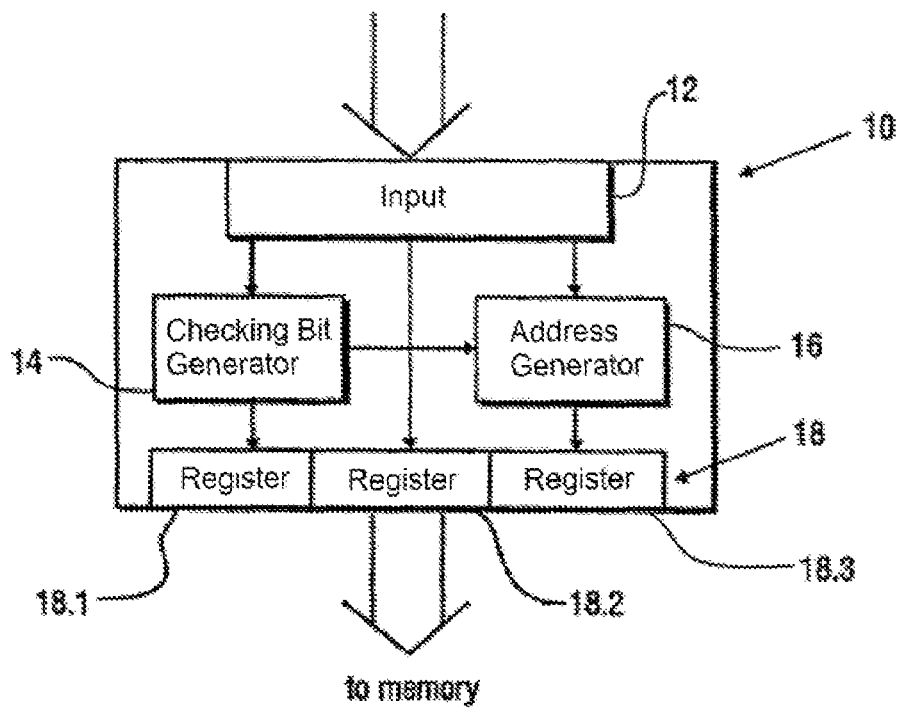
FIG. 1 is a simplified block diagram showing a preferred embodiment of the write controller of the invention.

FIG. 1 shows in a simplified block diagram a write controller 10. The write controller 10 has an input 12 and receives input data through input 12. Input 12 is connected with a checking bit generator 14 and with an address generator 16. Checking bit generator 14 has two outputs, one of which is connected with an address generator 16. The second output of checking bit generator 14 is connected to output 18 connecting write controller 10 to a memory (not shown). Output 18 comprises three output registers 18.1, 18.2 and 18.3. Output register 18.1 is connected with checking bit generator 14. Output register 18.2 is connected with input 12. Output register 18.3 is connected with address generator 16. The division of output 18 into three registers is not a necessary structural feature and only used here for purposes of explanation.

In the following, operation of the write controller will be described. It is assumed by way of example that the input data received represent a binary identifier of an integrated circuit to be stored in an MRAM memory provided with the integrated circuit. The identifier is classified as "read only".

Input bits received through input 12 are fed to checking bit generator 14. Checking bit generator 14 generates a checking bit for each input bit provided. The checking bit is generated using an inverter gate (not shown) comprised by checking bit generator 14. Checking bit generator 14 further provides a control signal to address generator 16. The control signal triggers address generator 16 to generate address information that allocates two adjoining memory cells to the input bit and the checking bit. As described above, alternative embodiments have different allocation algorithms that do not use a neighboring storage cell. The allocation algorithm used is implemented in address generator 16. The address information takes the form of a binary address code. The address code will be translated into corresponding electrical signals applied to a word line and a bit line, as known in the art, by a driver stage (not shown) arranged between the write controller and the memory in order to select the memory cell allocated to the address code. The driver stage may also be a part of the write controller. If the MRAM has only one line of memory cells, it is obvious to chose a simpler way of addressing the individual cells.

For writing an input bit and the allocated checking bit to the memory, the content of output registers 18.1 and 18.2 is fed to the memory along with the respective address information contained in output register 18.3. Of course, the output 18 may in an alternative embodiment collect a number of input bits and checking bits in order to feed a sequence of input and checking bits in parallel to the memory. For this, the output register space is larger.

The write controller described can be used for setting the identifier for instance before, during or after chip die testing. This can for instance be done using pads that are not connected in the packaging this results in a packaged chip whose identifier cannot be changed. This method can be used to create chips with all unique identifiers, or a batch of chips with the same identifier.

An alternative way to prevent tampering with the identifier after manufacture of a chip is to set the identifier once using the packaged chip and to subsequently block further writing by using logic or a trapdoor, e.g., in the form of a write-once register or some kind of fuse.

A further alternative way to prevent violation of the identifier is to use a password protection when writing the identifier and to use a hard coded password. The password cannot be read, but is checked by chip when trying to write the unique identifier.

Figure 2:
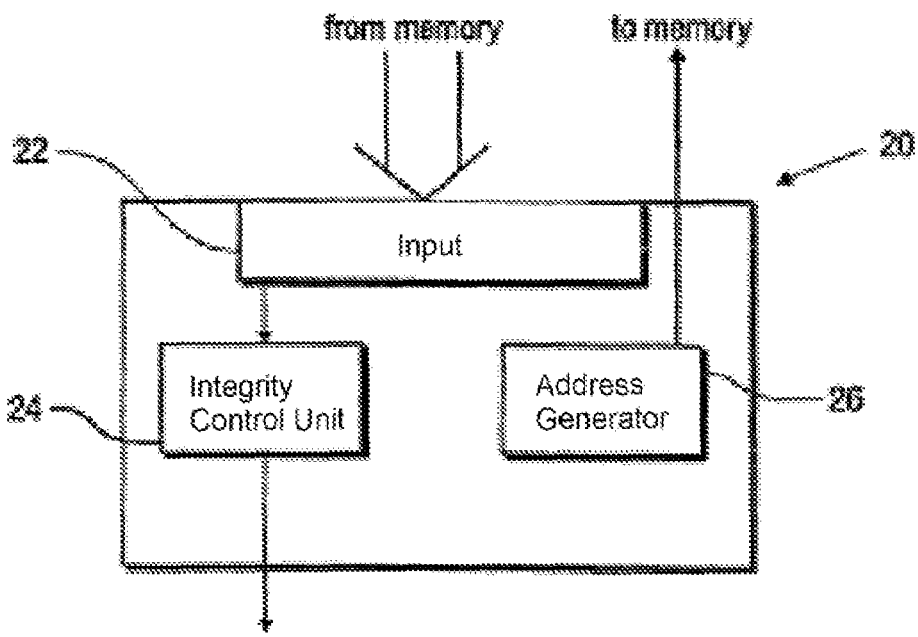
FIG. 2 is a simplified block diagram showing a preferred embodiment of the read controller of the invention.

FIG. 2 shows in a simplified block diagram a read controller 20. Read controller 20 comprises an input 22 through which it is connected to a memory (not shown). Input 22 is connected with an integrity control unit 24. Read controller 20 further comprises an address generator 26 that has an output connected to the memory.

In operation, address generator 26 provides address information of allocated memory cells comprising an input bit and an allocated checking bit. The particular address allocation algorithm is implemented in address generator 26. For the purpose of the present explanation, the allocation algorithm is again the use of adjoining memory cells, such as the next neighbor with an incremented column address in the same row of memory cells.

It is, of course, necessary to use the same allocation algorithm in the address generator of the read controller as in the address generator of the write controller used to write the checking bits to the memory.

The address information is presented to the memory in combination with a read command generated by read controller 20. After receiving the requested input and checking bits these are forwarded from input 22 to integrity control unit 24. Integrity control unit comprises a comparator (not shown) that creates an output signal indicating whether or not input and checking bit are complementary.

The output signal of the integrity control unit can be processed as desired by stages connected to the read controller.

A combined write/read controller integrates the structural features of the write controller of FIG. 1 and the read controller of FIG. 2 in one single device. It has a first interface to memory clients comprising the functionalities of input 12 and of the output of integrity control unit 24. It has a second interface to the memory comprising the functionalities of output 18 of write controller 10, input 22 of read controller 20, and of the output of address generator 26. It is noted that in a combined write/read controller only one address generator is necessary.

Figure 3:
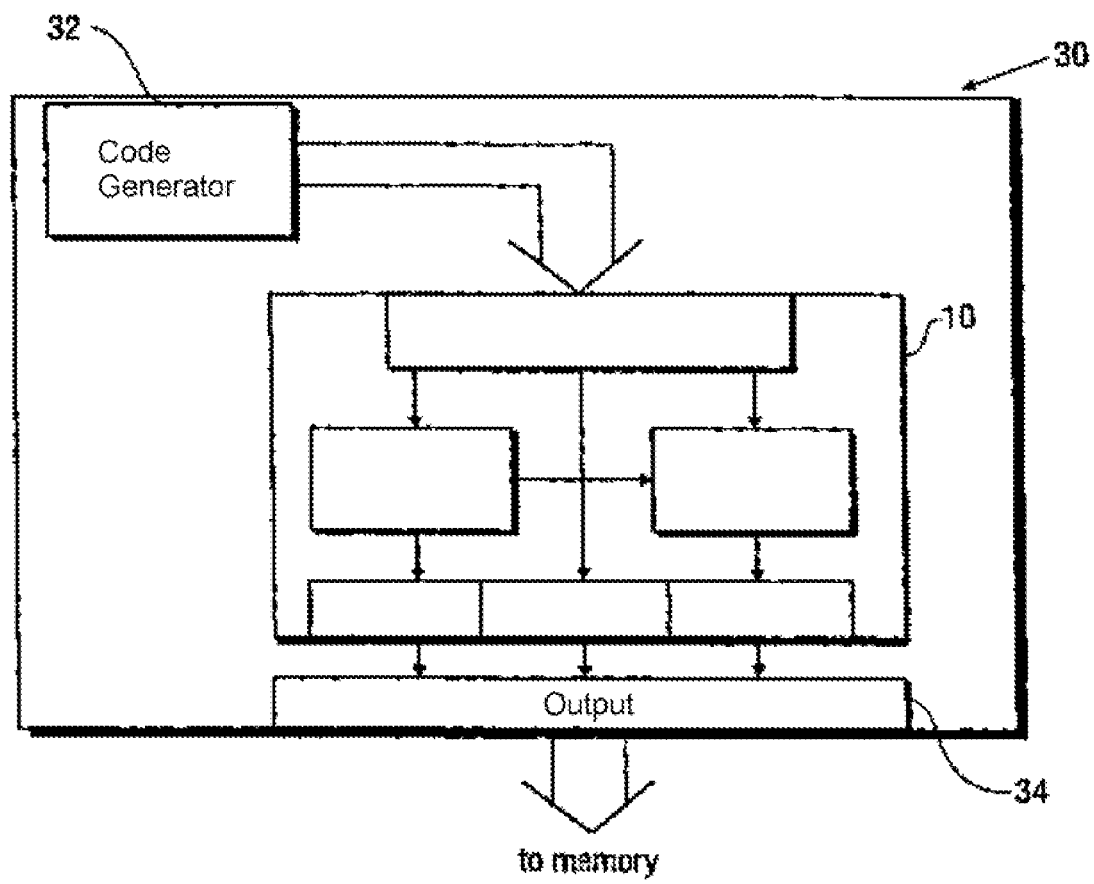
FIG. 3 is a simplified block diagram showing a preferred embodiment of the programmer device of the invention.

FIG. 3 shows in a simplified block diagram a programmer 30. Only features that are important for the present invention are shown. In addition the programmer may comprise an automatic wafer handler, test pins and control units for testing the individual dies of a wafer, as is known in the art.

Programmer 30 comprises a write controller according to the present invention. For reasons of simplicity, it is assumed that write controller 10 is implemented in programmer 30. Thus, for all structural and functional explanation of the write controller, reference is made to the description of FIG. 1.

Write controller 10 is connected to a code generator 32. Code generator 32 generates a unique address to be fed to input 12 of write controller 10. Write controller 10 is further connected to output 34 of programmer 30.

In operation, the programmer will generate a unique identifier to be stored in a memory of a chip that is being tested and programmed. Write controller 10 extends identifier by checking bits and provides the appropriate address information to output 34, which writes the ID to the memory arranged on the chip. Depending on the particular manufacturing environment the programmer is used in, the identifier is programmed using pads of an unpackaged chip in the die testing stage. As an alternative, the programming can be done on the packaged chip.

Figure 4:
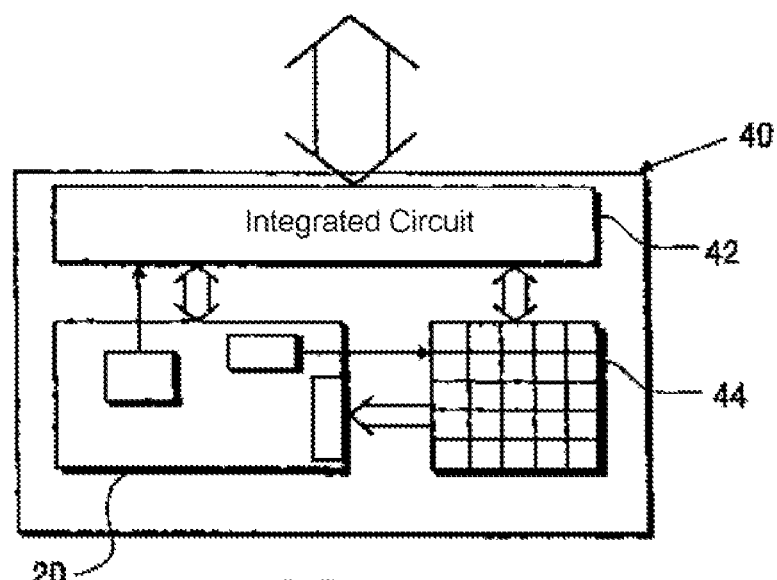
FIG. 4 is a simplified block diagram showing as a preferred embodiment of the solid state device of the invention an integrated circuit with a read controller of the invention.

FIG. 4 shows, as an embodiment of the solid state device of the invention, a simplified block diagram of a chip 40. The chip 40 comprises an integrated circuit 42, an MRAM 44, and a read controller, which for reasons of simplicity is assumed to be read controller 20. The particular structure and function of the integrated circuit 42 is not important in the present context. It may be connected to external units. MRAM 44 is shown by way of example as a two dimensional array of memory cells. We further assume that a unique identifier with checking bits was stored in MRAM 44 using programmer 30.

In operation of the chip, read controller 20 will check the integrity of the stored identifier as described with reference to FIG. 2. It will provide its output signal to the integrated circuit 42. As an example of a way to process the information of read controller 20, integrated circuit will stop operation when the signal provided by read controller 20 indicates that a checking bit is equal to an allocated code bit of the identifier.

Figure 5:
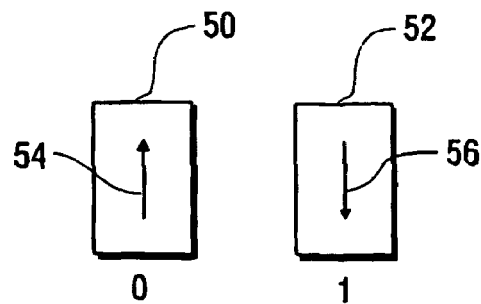
FIG. 5 is a diagram showing the representation of digital information in a magnetic storage cell.

FIG. 5 shows two memory cells 50 and 52 with arrows 54 and 56, respectively. The arrows symbolize an orientation of a magnetic moment of a layer in the memory cell that aligns with an applied magnetic field used for writing the memory cell. Two possible orientations are imposed on the layer by the writing field and other magnetic layers comprised in the memory cell. Each orientation can therefore represent the two possible states of one bit, up and down, or 0 and 1.

FIG. 6 through 10 show block diagrams each representing a binary code stored in an MRAM using a different embodiments of the method of the present invention for writing data comprising at least one input bit to a memory having non-volatile storage cells.

Figure 6:
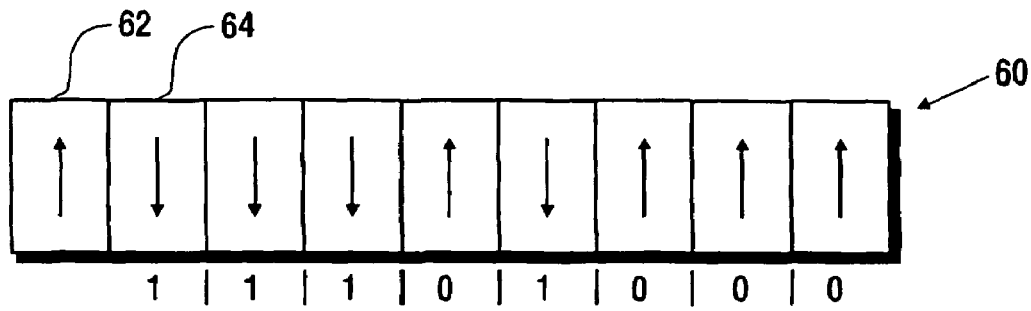
FIG. 6 is a block diagram representing a binary code stored in an MRAM using a first preferred embodiment of the method for writing data comprising at least one input bit to a memory having non-volatile storage cells.

FIG. 6 shows an MRAM 60 with a stored code sequence "11101000". There is one checking bit provided in a memory cell 62 allocated to its neighboring memory cell 64. All other code bits are stored without checking bits. This example solves the problem raised by the vulnerability of an MRAM to high external magnetic fields. It such a field is applied all cells with have either the up or the down orientation. The presence of the antiparallel pair of cells 62 and 64 indicates the integrity of the code sequence.

Figure 7:
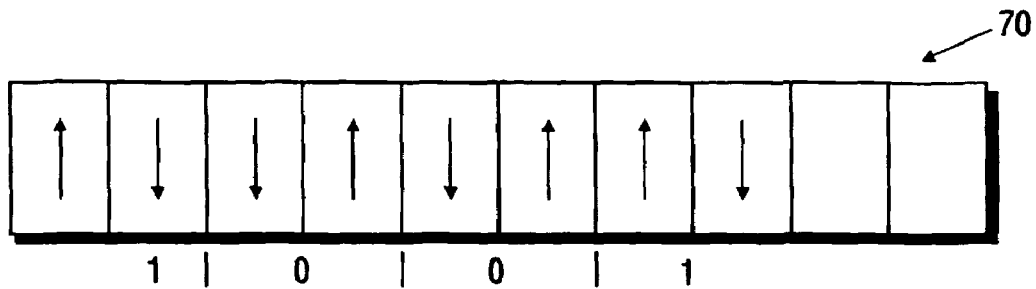
FIG. 7 is a block diagram representing a binary code stored in an MRAM using a second preferred embodiment of the method for writing data comprising at least one input bit to a memory having non-volatile storage cells.

FIG. 7 shows an MRAM 70 with a stored code sequence "1001". Each code bit has an allocated checking bit in the neighboring memory cell to the left. The present example increases the reliability of the stored code sequence for localized tampering attempts.

Figure 8:
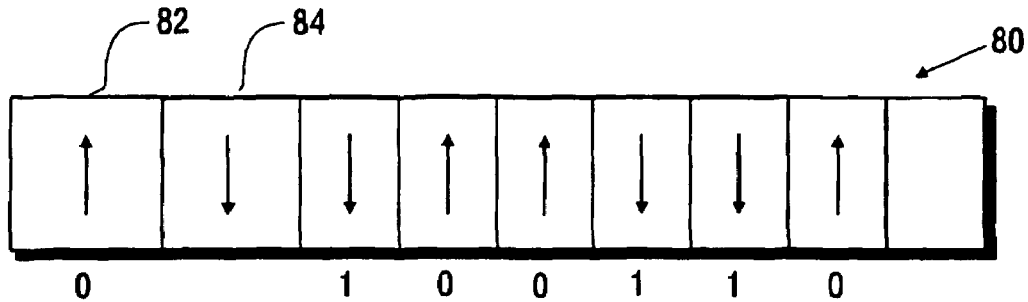
FIG. 8 is a block diagram representing a binary code stored in an MRAM having two groups of memory cells with different sizes, using a third preferred embodiment of the method for writing data comprising at least one input bit to a memory having non-volatile storage cells.

FIG. 8 shows an MRAM 80 with a stored code sequence "0100110". As in the example of FIG. 6, there is only one code bit that as 82 that has an allocated checking bit 84. However, in this example the allocated checking bit is stored in the neighboring cell to the right side of the code bit. In addition, the selected code bit and its allocated checking bit are stored in a cell having a larger size than his other cells. This increases the robustness of the integrity control bits.

Figure 9:
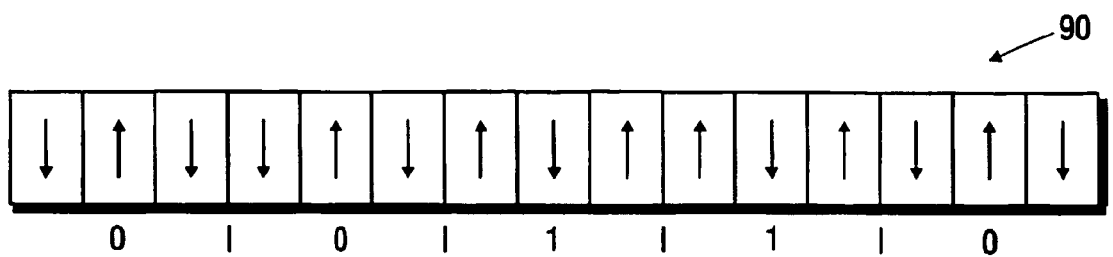
FIG. 9 is a block diagram representing a binary code stored in an MRAM using a fourth preferred embodiment of the method for writing data comprising at least one input bit to a memory having non-volatile storage cells.

FIG. 9 shows an MRAM 90 with a stored code sequence "00110". In this example, three memory cells are used to store one code bit. Each code bit has two neighboring checking bits. This example solves the problem raised by random bit flipping that it cannot be decided whether the code bit or the checking bit has flipped. By having the code bit in the middle between two anti-parallel checking bits it can be established which bit has flipped its orientation. Only if a code bit has changed its orientation, the integrity of the stored code is violated.

Figure 10:
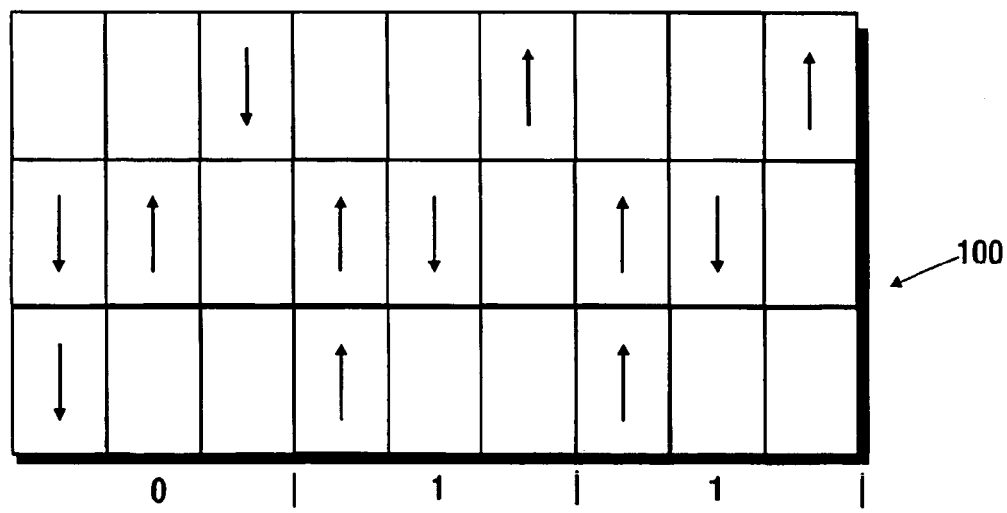
FIG. 10 is a block diagram representing a binary code stored in an MRAM using a fifth preferred embodiment of the method for writing data comprising at least one input bit to a memory having non-volatile storage cells.

FIG. 10 shows as a further example an MRAM 100 storing the code sequence "011" in a two-dimensional array memory cells. A group of 9 memory cells in three rows and three columns is used for storing each bit. The code bit is stored in the central memory cell of each group and is surrounded by 8 memory cells, only three of which are used for checking bits. All other memory cells shown as empty may have an arbitrary orientation, either up or down. This example addresses the problem of a localized tampering attempt in which the person trying to change the code knows that checking bits are used. Using a two-dimensional pattern of checking bits that is hidden between arbitrarily oriented cells makes it hard to detect the checking bit pattern used. This way the integrity control method of the invention can be protected against manipulations on the code bits and the allocated checking bits at the same time.

Figure 11:
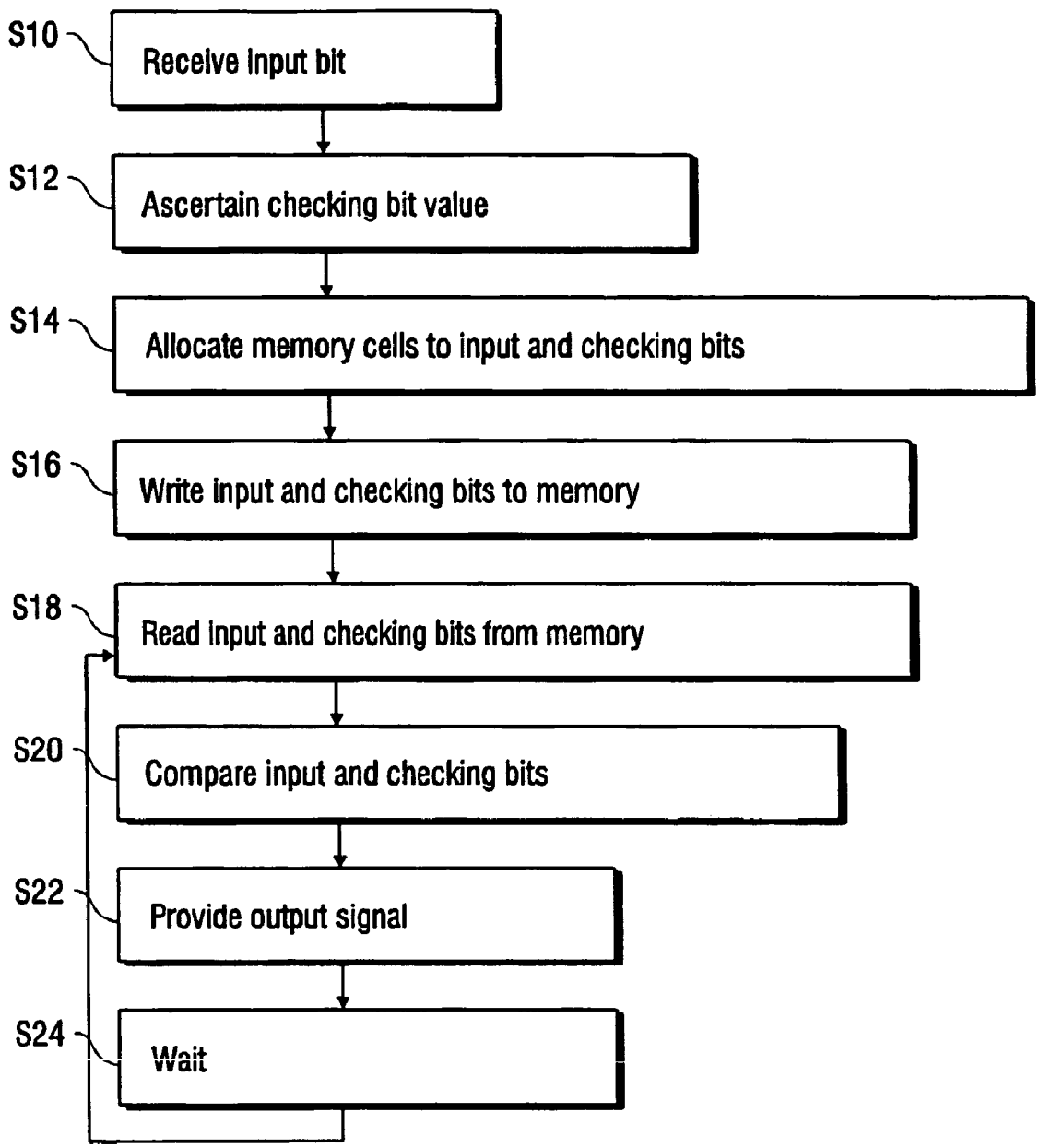
FIG. 11 is a flow diagram of a preferred embodiment of the method for controlling the integrity of data stored in non-volatile storage cells of a memory.

FIG. 11 shows a flow diagram of a preferred embodiment of the method for controlling the integrity of data stored in non-volatile storage cells of a memory. In a step S10 input bits to be stored are received. In a step S12 a checking bit value is ascertained for the input bit received in step S10. The checking bit has the complementary value of the input bit. In a step S14 memory cells are allocated to the input and checking bits using one of the allocation algorithm as described above. In a step S16 input and checking bits are stored to the allocated memory cells. After step S16 there may be a waiting step (not shown) before the integrity control starts with step S18, in which the input and checking bits are read from the memory. In step S20 input and checking bits are compared with each other. In step S22 an output signal is provided indicating whether or not input and checking bit are equal. The integrity control between steps S18 and S22 is repeated after a waiting step S24.

The invention claimed is:

1. A write controller for a memory with a plurality of non-volatile storage cells, comprising an input for receiving input data having a plurality of input bits to be written to said memory, and being configured to generate from said input data output data and allocated address information,
    wherein said output data comprises said input data and at least one checking bit allocated to each of said input bits, said checking bit having a value complementary to that of the respective input bit such that if the value of said respective input bit is one, then the value of said checking bit is zero and vice versa, and
    wherein said address information allocates said checking bit to a storage cell allocated to another storage cell storing said respective input bit.

2. The write controller of claim 1, being configured to generate address information allocating said checking bit to a storage cell neighboring the storage cell storing said respective input bit.

3. The write controller of claim 2, wherein said output data comprises a number of checking bits allocated to each of said input bits, said number ranging between 2 and 8, and wherein said address information allocates each checking bit to a respective storage cell in a linear or matrix-like arrangement of storage cells, such that a linear or two-dimensional pattern of stored bit values is created for each set of input bit and checking bits allocated thereto.

4. The write controller of claim 1, comprising a checking bit generator connected to said input and configured to ascertain the bit value of each of said input bits and to generate at least one checking bit.

5. The write controller of claim 1, comprising an address information generator connected to said input and to said checking bit generator, and configured to allocate to each of said input bits and to said allocated at least one checking bit respective address information of storage cells neighboring each other.

6. A read controller for a memory with a plurality of non-volatile storage cells, comprising an input for receiving read-out data from said memory having a plurality of input bits and at least one checking bit allocated thereto, and an integrity-control unit configured to compare each of said input bits and said at least one checking bit and to provide an output signal indicating whether or not said input bit and said checking bit are complementary, said input bit and said checking bit being complementary if the input bit is one and the checking bit is zero or vice versa.

7. The read controller of claim 6, comprising an address generator being configured to generate a read request directed to at least one selected memory cell and said at least one neighboring memory cell storing said allocated checking bit.

8. A method for writing data comprising a plurality of input bits to a memory having non-volatile storage cells, comprising the steps of
    a) ascertaining a bit value of at least one checking bit allocated to each of said input bits as the bit value complementary to the bit value of that input bit, the bit values of said input bit and said checking bit being complementary if the bit value of said input bit is one and the bit value of said checking bit is zero or vice versa,
    b) allocating non-volatile memory cells to each of said input bits and the respective at least one checking bit according to a predetermined allocation algorithm, and
    c) writing each of said input bits and the respective at least one checking bit to the non-volatile storage cells of said memory allocated according to step b).

9. The method of claim 8, wherein said data comprises an identifier allocated to the memory.

10. The method of claim 8, wherein said allocation algorithm comprises allocating each of said input bits and the respective at least one checking bit to neighboring storage cells.

11. The method of claim 8, which is performed before, during or after a test of a die containing the memory.

12. The method of claim 8, wherein after said writing step further writing to the memory is blocked.

13. The method of claim 8, wherein said writing step is performed after a step of providing a password and verifying the identity of the provided password with a password that is stored on a chip containing the memory.

14. A method for controlling the integrity of data comprising a plurality of input bits stored in non-volatile storage cells of a memory, comprising the steps of
    a) ascertaining a bit value of at least one checking bit allocated to each of said input bits as the bit value complementary to the bit value of that input bit, the bit values of said input bit and said checking bit being complementary if the bit value of said input bit is one and the bit value of said checking bit is zero or vice versa,
    b) allocating non-volatile storage cells to each of said input bits and the respective at least one checking bit according to a predetermined allocation algorithm,
    c) writing each of said input bits and the respective at least one checking bit to the non-volatile storage cells allocated according to step b),
    d) reading each of said input bits and the respective at least one checking bit from said allocated storage cells,
    e) comparing each of said input bits and the respective at least one checking bit, and
    f) providing a signal indicating whether or not each of said input bits and the respective at least one checking bit are complementary.

* * * * *